(12) United States Patent
Thomas et al.

(10) Patent No.: US 11,996,855 B2
(45) Date of Patent: May 28, 2024

(54) RESISTOR DAC GAIN CORRECTION

(71) Applicant: Analog Devices International Unlimited Company, Limerick (IE)

(72) Inventors: Andrew Joseph Thomas, Arlington, MA (US); Roberto Sergio Matteo Maurino, Turin (IT)

(73) Assignee: Analog Devices International Unlimited Company, Limerick (IE)

( * ) Notice: Subject to any disclaimer, the term of this patent is extended or adjusted under 35 U.S.C. 154(b) by 181 days.

(21) Appl. No.: 17/682,990

(22) Filed: Feb. 28, 2022

(65) Prior Publication Data

US 2023/0275592 A1 Aug. 31, 2023

(51) Int. Cl.
*H03M 1/06* (2006.01)

(52) U.S. Cl.
CPC .................. *H03M 1/0604* (2013.01)

(58) Field of Classification Search
CPC ..... H03M 1/0604; H03M 1/742; H03M 3/464
See application file for complete search history.

(56) References Cited

U.S. PATENT DOCUMENTS

| | | | |
|---|---|---|---|
| 6,288,661 B1* | 9/2001 | Holberg | H03M 1/682 341/145 |
| 7,009,541 B1* | 3/2006 | Nguyen | H03M 3/356 341/120 |
| 7,151,474 B2 | 12/2006 | Ortmanns et al. | |
| 7,205,920 B2 | 4/2007 | Morrow et al. | |
| 7,227,481 B2 | 6/2007 | Del et al. | |
| 7,436,338 B2 | 10/2008 | Hales et al. | |
| 7,561,089 B2 | 7/2009 | Zare-hoseini et al. | |
| 7,659,840 B2 | 2/2010 | Edelson et al. | |
| 7,671,773 B2 | 3/2010 | Ceballos | |
| 7,903,011 B2 | 3/2011 | Werking | |
| 8,154,433 B2 | 4/2012 | Mclachlan et al. | |
| 8,164,500 B2 | 4/2012 | Ahmed et al. | |
| 8,325,074 B2 | 12/2012 | Kinyua | |
| 8,723,709 B2 | 5/2014 | Oku | |
| 9,912,144 B2 | 3/2018 | Caldwell et al. | |
| 9,968,301 B2* | 5/2018 | Chiu | A61B 5/7246 |
| 10,148,278 B2 | 12/2018 | Bresciani et al. | |
| 10,763,976 B1* | 9/2020 | Schaefer | H04B 15/00 |
| 10,855,299 B2 | 12/2020 | Shabra et al. | |
| 11,476,859 B1* | 10/2022 | Agrawal | H03M 1/0617 |

(Continued)

*Primary Examiner* — Lam T Mai
(74) *Attorney, Agent, or Firm* — Schwegman Lundberg & Woessner, P.A.

(57) ABSTRACT

Systems and techniques for Digital-to-Analog Converter (DAC) gain correction are described herein. A digital-to-analog converter (DAC) circuit can include a switch bridge circuit having a first leg and a second leg that define respective mutually exclusive first and second DAC signal paths. The DAC circuit can further include a first compensation circuit configured to provide a first compensation current to the first leg of the switch bridge to compensate for a current defect caused by a voltage drop across a portion of the first DAC signal path. The DAC circuit can also include a second compensation circuit configured to provide a second compensation current to a second leg of the switch bridge to compensate for a voltage drop across a portion of the second DAC signal path. The DAC circuit can be included in a larger circuit such as a continuous time sigma delta (CTSD) analog-to-digital converter (ADC).

18 Claims, 7 Drawing Sheets

(56) References Cited

U.S. PATENT DOCUMENTS

| | | | | |
|---|---|---|---|---|
| 11,545,996 B1* | 1/2023 | Maurino | ............. | H03F 3/45973 |
| 11,777,496 B1* | 10/2023 | Chakraborty | ........ | H03D 7/1425 |
| | | | | 327/291 |
| 2005/0088229 A1* | 4/2005 | Regier | ................ | H03F 3/45928 |
| | | | | 330/69 |
| 2016/0020779 A1* | 1/2016 | Zhu | ......................... | H03M 1/66 |
| | | | | 341/144 |
| 2016/0173299 A1* | 6/2016 | Islam | ..................... | H04L 25/10 |
| | | | | 375/232 |

\* cited by examiner

RESISTOR DAC GAIN CORRECTION

TECHNICAL FIELD

The present disclosure generally relates to electronics, and more specifically to Digital-to-Analog Converter (DAC) gain correction.

BACKGROUND

In many electronic applications, digital signals/data streams are converted to an analog signal using a Digital-to-Analog Converter (DAC). Generally, a DAC converts finite precision time-series data to a continually varying physical signal. A DAC can also reconstruct an original signal from sampled data. DACs are used in devices such as music players to convert digital signals to analog audio signals, in televisions and mobile phones to convert digital video data into analog video signals, or the like.

DACs are generally included in many different types of circuits, including Analog-to-Digital Converters (ADC) circuits. DACs and ADCs are often used together in digital systems to provide a complete interface with analog sensors and output devices for control systems (e.g., automotive engine controls). An example of an ADC circuit that can include a DAC is the Continuous-Time Sigma-Delta (CTSD) ADC.

DACs can cause current defects due to voltage drops across the switches in the DAC signal paths (e.g., a differential voltage can cause a differential current in the circuit). The defect can cause gain error or gain drift to occur in the circuit, which can affect the performance of the circuit.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Digital-to-Analog Converters (DACs) are used in a wide range of electronic applications. Many high-resolution Analog-to-Digital Converters (ADCs) are built around a DAC. Once such example of an ADC using a DAC is a sigma-delta ADC. In a sigma-delta ADC, a DAC can be used as a part of a feedback loop. The feedback DAC in a sigma-delta ADC converts a quantized output to an analog signal that is fed back to the input of a loop filter where the feedback signal is subtracted from the input signal prior to filtering by the loop filter.

In another example, a CTSD modulator can use a continuous-time integrator for the loop filter and a current steering feedback DAC. The current steering feedback DAC can include one or more current steering elements connected to a signal source and a reference node. In a CTSD modulator, a goal can be to achieve good direct current (DC) accuracy. To achieve this, the resistance of the input stage of the CTSD can be matched to the resistance of the current steering DAC so that current flowing from the input stage and current flowing from the DAC are balanced under ideal operating conditions.

There are different ways to achieve this resistance matching to correct for, e.g., current defects introduced by the voltage drops across the DAC switches. The DAC switches can include transistors (e.g., NMOS transistors). The transistors have an "ON" resistance that affects the sources, resistors, or other circuit elements connected to the legs of the DAC.

In an example, one technique to correct the current defects is to introduce a pair of switches in the input path coupled to the input nodes. This solution has drawbacks however, including issues such as gain error (e.g., gain drift) and distortion when the switches are driven using a common mode signal. Thus, the common-mode signal has to be removed so that only a differential current passes through the switches. One solution to fix this issue is to arrange a common-mode amplifier in the input stage such that the switches on the input stage can operate on differential signals. In such an example, the solution used to correct the current defect caused by the voltage drop in the switches of the DAC introduces a new and different error or problem into the circuit, and such error must also be corrected to optimize circuit performance.

Another solution to correct the current defect is to connect compensation circuitry to the DAC circuit itself. The compensation circuitry can generate a signal, such as a compensation signal (sometimes referred to as a correction signal or cancellation signal) that can account for the voltage drop across the switches of the DAC. This technique helps correct the current defect caused by a voltage drop across the DAC switches without introducing another problem/issue (e.g., a new gain error) into the circuit such as by including switches in the input path as previously discussed.

In an example, a DAC circuit can include a switch bridge circuit having a first leg that provides respective first and second DAC signal paths. The DAC circuit can also include a first compensation circuit configured to provide a first compensation current to the first leg of the switch bridge to compensate for a current defect caused by a voltage drop across a portion of the first DAC signal path.

The first leg of the switch bridge can include a first switch, and the compensation circuit can include a voltage generator circuit configured to generate a voltage signal having a voltage magnitude that corresponds to the voltage drop across the portion of the first DAC signal path. The voltage generator circuit can be an replica circuit configured to mimic the operation of the first switch. In such an example, the compensation current can be derived from the replica switch before being provided to the first leg of the switch bridge. In another example, the voltage generator circuit can be a second leg of the switch bridge.

In an example, voltage generator circuit can include a scaled switch configured to provide a voltage drop greater than the voltage drop across the portion of the first DAC signal path. The compensation circuit can further include a resistor coupled from the scaled switch to the first leg of the switch bridge. This can allow the compensation circuit to output a "gained up" voltage that is some magnitude greater than the voltage drop across the first DAC signal path as necessary, desired, or appropriate. The first compensation circuit can be further configured to receive information about the voltage drop across the portion of the first DAC signal path and, in response, the first compensation circuit can generate the first compensation current.

In an example, the first compensation circuit can include an amplifier, and a feedback network coupled to the amplifier. The feedback network can include multiple resistors. The non-inverting input of the amplifier can be coupled to the first leg of the switch bridge. The amplifier can be configured to provide the first compensation current to the first leg of the switch bridge through a compensation resistor, and the output of the amplifier can be connected to the compensation resistor. The compensation resistor can be a high value resistor that has a greater resistance than the resistors of the feedback network.

In an example, the DAC circuit can further include a low-pass filter, the low-pass filter including a capacitor in the feedback network. The DAC: can also include a second compensation circuit configured to provide a second compensation current to a second leg of the switch bridge to compensate for a voltage drop across a different portion of the DAC signal path. The second compensation circuit can include a second amplifier and a second feedback network coupled to the second amplifier. The second feedback network can also include multiple resistors. The non-inverting input of the second amplifier can be coupled to a second leg of the switch bridge.

The DAC circuit can further include an additional series circuit element (e.g., an inductor) coupled between the first compensation circuit and the first leg of the switch bridge. The first compensation circuit additionally receives information about a voltage drop across the additional series circuit element and can adjust the first compensation current based on the information about the voltage drop across the additional series circuit element.

Figure 1:
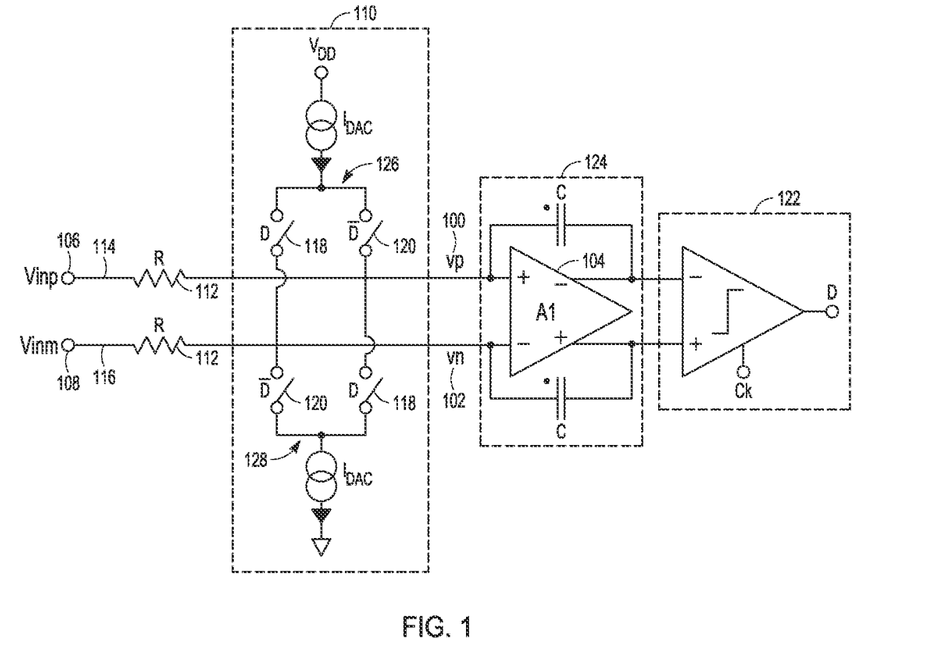
FIG. 1 illustrates an example of a differential Continuous-Time Sigma-Delta (CTSD) Analog-to-Digital Converter (ADC).

FIG. 1 illustrates an example of a differential Continuous-Time Sigma-Delta (CTSD) Analog-to-Digital Converter (ADC). The CTSD of FIG. 1 is a single-bit, first-order CTSD. The CTSD can include single-bit DAC circuitry 110, integrator circuitry 124, and quantizer circuitry 122. The integratory circuitry 124 can include an amplifier 104.

In an example, the CTSD of FIG. 1 is fully differential and the common mode voltage at the inputs of the amplifier 104, including a first input $V_p$ 100 and a second. $V_n$ 102, can be set by the common mode of the input voltage $V_{icm}$, where $V_{icm}$ is the sum of the input voltages at input nodes $V_{inp}$ 106 and $V_{inm}$ 108, divided by two, as shown in Equation 1.

$$V_{icm} = \frac{V_{inp} + V_{inm}}{2} \quad \text{Eq. 1}$$

An input stage of the CTSD of FIG. 1 can include a pair of input resistors 112 (e.g., each having a resistance R), with each resistor 112 in a respective one of a first signal path 114 and a second signal path 116, and coupled to a corresponding one of the pair of differential input nodes 106 and 108. The DAC circuitry 110 can include a current steering DAC that can include a switch bridge with a first leg switching a node 126 and a second leg switching node 128. The switch bridge can include switches 118 and 120. The switches 118 and 120 can be implemented using CMOS devices, such as NMOS transistors, or any other suitable switching devices. The switches 118 are concurrently controlled by a digital codeword 1) and the switches 120 controlled by the complement of D represented by $\overline{D}$. That is, when switches 118 are in a closed state, switches 120 are in an open state, and vice versa. The digital codeword D is output by the quantizer circuitry 122 and can be fed back to the DAC: circuitry 110. In turn, the DAC circuitry 110 can generate a feedback signal (e.g., a feedback current signal) according to the digital codeword D. This feedback current signal can be combined with the current injected by the input circuitry, for example, before being integrated by the integrator circuitry 124.

Under ideal operating conditions, current generated by the DAC circuitry 110 will match the current injected by any input circuitry of the CTSD, and the output of quantizer circuitry 122 can provide an accurate digital representation of the analog input signal. In reality, however, the switches of the DAC circuitry 110 can inject a current defect into the circuit, for example, that can be caused by a voltage drop across each of the switches of the DAC circuitry 110 such as switches 118 or switches 120. One technique to correct the current defect includes introducing a pair of switches in the input path between input nodes 106 and 108 and the DAC circuitry 110 (e.g., in series with resistors 112). Such a solution, however, introduces other problems such as distortion that in turn may need to be corrected.

Another technique to address the current defect problem can include providing a current signal to the DAC circuitry 110, for example at the DAC switches, such as switches 118 and 120, to account for the "missing" current due to the voltage drop across the switches of the DAC. That is, the current defect introduced into the CTSD can be corrected using gain correction or compensation circuitry such as can be connected to one or both of the legs of the switch bridge of the DAC.

Figure 2:
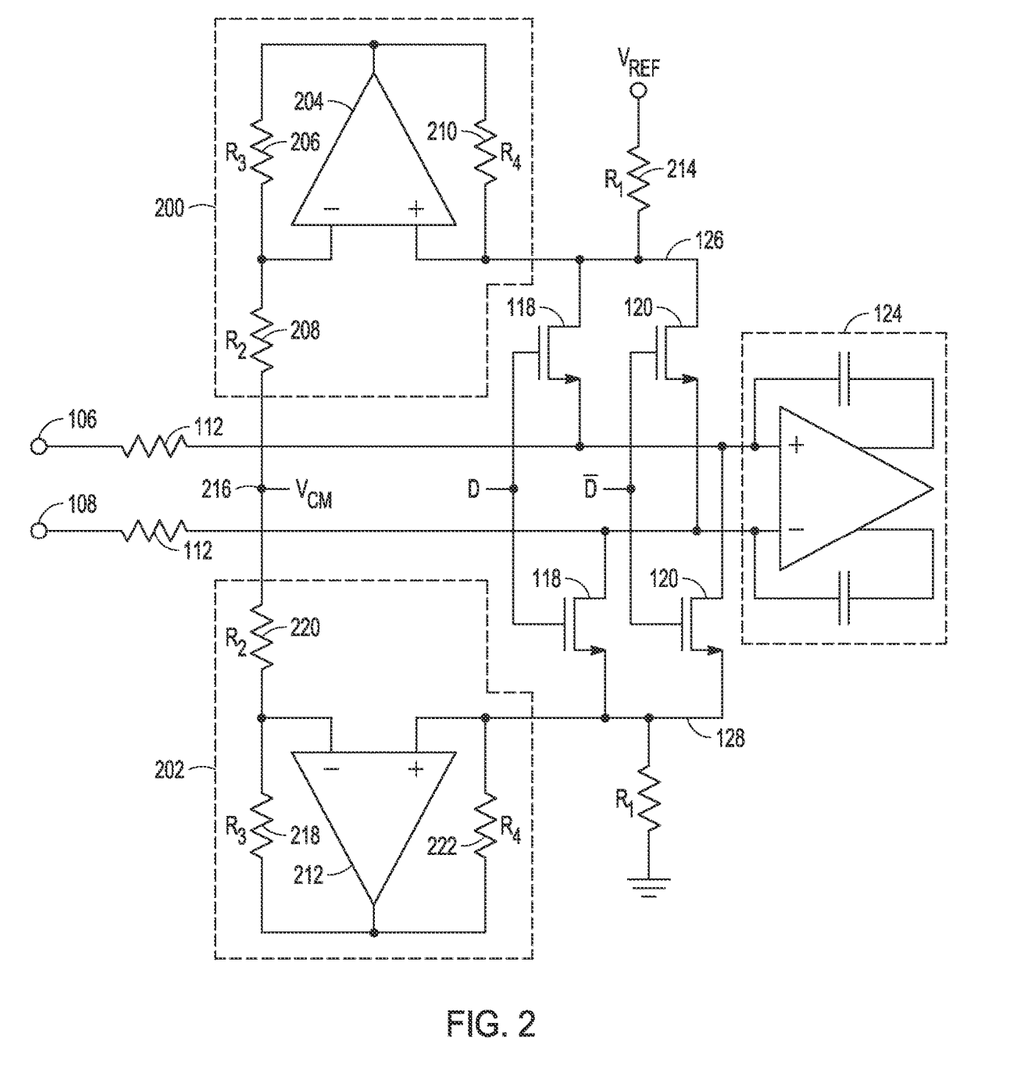
FIG. 2 illustrates an example of a compensation circuit for a Digital-to-Analog Converter (DAC) circuit.

FIG. 2 illustrates an example of a compensation circuit for a Digital-to-Analog Converter (DAC) circuit. In the example illustrated in FIG. 2, a first compensation circuit 200 can be connected to the first leg at node 126 of the switch bridge, and a second compensation circuit 202 can be connected to the second leg at node 128 of the switch bridge. It is understood that a switch bridge can have as many legs as desired or necessary. It is further understood that the DAC can have multiple switch bridges with multiple legs as desired or appropriate for the circuit in which the DAC is included.

The first compensation circuit 200 can include an amplifier 204 and a resistive feedback network coupled to the amplifier 204. The resistive feedback network can include a first resistor 206 (labeled $R_3$) connected to an output of the amplifier 204 and to an inverting input of the amplifier 204. The first compensation circuit 200 can further include a first compensation resistor 210 (labeled $R_4$) connected to the output of the amplifier 204 and the positive input of the amplifier 204. The first compensation resistor 210 can conduct current from the output of the amplifier 204 to the positive input of the amplifier 204. The first compensation circuit 200 can also include a third resistor 208 (labeled $R_2$) in series with the first resistor 206.

The second compensation circuit 202 can include a second amplifier 212, and a similar resistive feedback network as included in the first compensation circuit 200, connected to the second amplifier 212 in the same manner as the first resistor 206, third resistor 208, and first compensation resistor 210 are connected to the amplifier 204. That is, the second compensation circuit 202 can include a fourth resistor 218 in series with a fifth resistor 220 and connected to the output and to the inverting input of the second amplifier 212. The second compensation circuit 202 can also include a second compensation resistor 222 connected to the output and the positive input of the second amplifier 212. The second compensation resistor 222 can conduct a current from the output of the second amplifier 212 to the positive input of the second amplifier 212.

The first compensation circuit 200 and the second compensation circuit 202 can be coupled to a bias source 216. In an example, the bias source can be a common mode reference point (labeled $V_{CM}$ in FIG. 2). For example, the third resistor 208 in the first compensation circuit 200 and the fifth resistor 220 in the second compensation circuit 202 can be connected to the bias source 216. In embodiments where the common-mode current defect does not need correction, bias source 216 may be omitted and resistors 208 and 220 merged it is understood that the first compensation circuit 200 and the second compensation circuit 202 can be connected to any appropriate point within a circuit in which they are included (e.g., the legs of the circuit containing the third resistor 208 and the first compensation circuit 200 can be biased separately, or can be connected to different portions of or different circuit elements in a circuit in which the first compensation circuit 200 and the second compensation circuit 202 are included). It is understood, that in some circuits only a single compensation circuit can be desired or needed, and in others two or more compensation circuits can be desired or needed.

The output of the amplifier 204 can be connected to the first leg 126 of the switch bridge via the first compensation resistor 210. Similarly, the output of the second amplifier 212 can be connected to the second leg 128 of the switch bridge via the second compensation resistor 222. The resistance values for the resistors of the resistive feedback network in the first compensation circuit 200 and the second compensation circuit 202 can be based on the value of the primary reference resistor 214 (labeled $R_1$), which can be a part of the DAC circuitry 110. The total current through the DAC switches 118 and 120 is not affected by the "ON" resistance of the MOS switches and has a value according to Equation 2:

$$\frac{V_{ref}}{R_1} \qquad \text{Eqn. 2}$$

The correction circuitry can measure the voltage drop across the DAC switches 118 and 120, optionally buffer or gain up the voltage, and provide a corresponding current to the switches 118, 120, for example, having a magnitude characteristic that matches the amount of current determined to be absent from the primary reference path. In this way, the first compensation circuit 200 can help correct for the current defect caused by, e.g., the voltage drops across the DAC: switches 118, 120.

Figure 3:
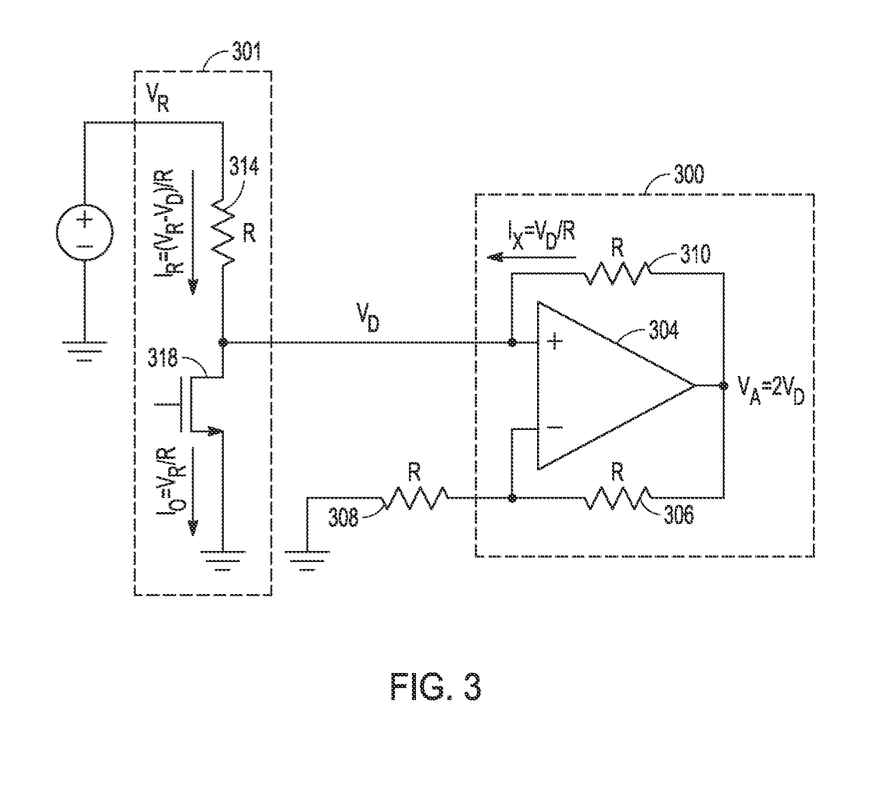
FIG. 3 illustrates an example of a simplified compensation circuit.

FIG. 3 illustrates an example of a simplified compensation circuit. In the example of FIG. 3, a compensation circuit 300 can be connected to a voltage generator circuit 301, The voltage generator circuit 301 can include a switch 318, such as can be a switch in a leg of the switch bridge of the DAC, similar to those discussed above. Alternatively, switch 318 can be a replica switch configured to mimic operation of one or more switches in the DAC, such as switches 118 or 120. If the switch 318 is a replica switch, then it can have the same characteristics (e.g., same material type, same size, same operating characteristics such as on resistance or voltage drop, or the like) as one or more of the switches in the switch bridge of the DAC to which compensation current is coupled.

The voltage drop across a portion the voltage generator circuit 301 signal path can be determined. For example, the voltage $V_R$ can be the voltage across a portion of the DAC signal path. It can also be determined that the current through the reference resistor is:

$$I_R = \frac{(V_R - V_D)}{R} \qquad \text{Eqn. 3}$$

In the absence of a current defect, the current exiting the switch 318 is:

$$I_o = \frac{V_R}{R} \qquad \text{Eqn. 4}$$

Thus, the voltage drop in the switch 318, or $V_D$ in FIG. 3, can be considered to be "missing" from the current in the switch 318. The operational amplifier 304 can provide voltage gain so that the output of the operational amplifier 304, $V_A$, is a multiple of $V_D$ (e.g., $2V_D$). As a result, the current provided from the output of the operational amplifier 304 through compensation resistor 310 can account for the missing voltage due to the voltage drop across the switch 318, and this "corrected" current can be provided to the legs of the switch bridge to compensate for a current defect.

In an example, the compensation circuit 300 of FIG. 3 can operate as a negative impedance converter circuit. The operational amplifier 304 with the three resistors 306, 308, and 310 can create an apparent impedance at the positive input terminal of the operational amplifier 304 of –R. When placed in parallel with the reference resistor 314, the combined impedance can be effectively infinite, forming a high impedance current source whose value is not affected by the voltage $V_D$.

Figure 4:
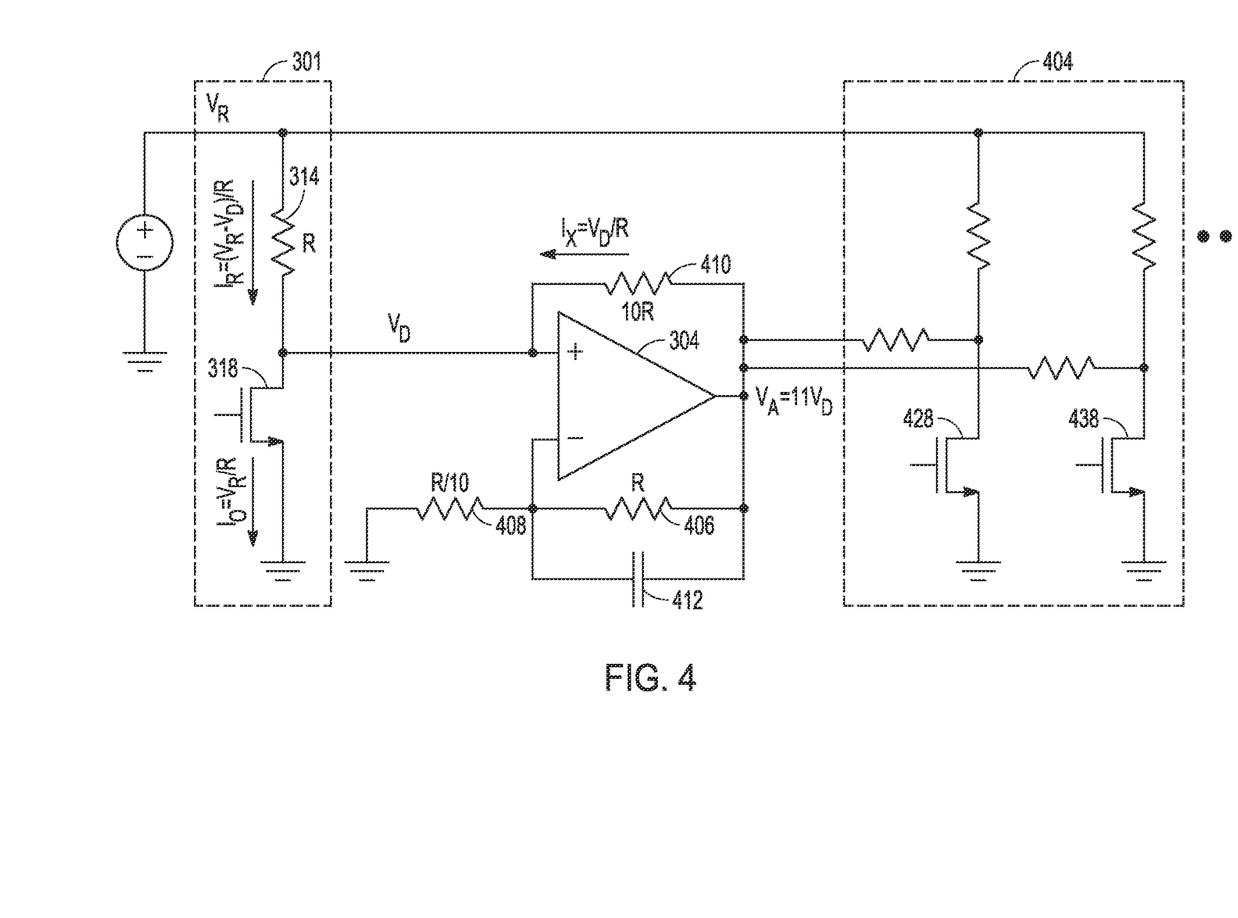
FIG. 4 illustrates an example of a compensation circuit with additional compensation legs

FIG. 4 illustrates an example of a compensation circuit with improved properties. In an example, the gain correction circuit in FIG. 3 can be modified to reduce the noise contribution by the resistors of the compensation circuit by increasing the gain of the voltage drop $V_D$. This can be done by replacing the compensation resistor with a high-value resistor 410. The high-value resistor 400 can have a resistance that is much higher (e.g., ten times higher) than the reference resistor 314 that is a part of the voltage generator circuit 301. It is understood that any of the resistance values in the resistors of the compensation circuit can be adjusted to achieve a desired gained up voltage. For example, the resistor 308 in FIG. 3, which has a matching value, R, of the reference resistor 314 can be replaced with resistor 408 having a resistance value of $$\frac{R}{10}.$$

In an example, the operational amplifier 304 can also generate noise in the circuit. If noise from the operational amplifier 304 is of concern, a low-pass filter can be added to the compensation circuit. The low-pass filter can include capacitor 412 across the feedback resistor (e.g., resistor 406) in the compensation circuit. The low-pass filter can reduce unwanted signals output from the operational amplifier 304 that are above a certain frequency.

Similar to the compensation circuit illustrated in FIG. 3, the compensation circuit of FIG. 4 can include the voltage generator circuit 301. Again, the voltage generator circuit 301 can include a switch 318, which can be a switch in an actual leg of the switch bridge of the DAC, similar to those discussed above. Alternatively, switch 318 can be a replica switch configured to mimic operation of one or more switches in the DAC. Further, as illustrated in FIG. 4, a single compensation circuit can provide compensation current to multiple switches (e.g., switches 428 and 438) in a multi-bit DAC 404. While the multi-bit DAC 404 shows two legs, it is understood that the compensation circuit can provide compensation current to additional legs in the multi-bit DAC 404.

One advantage of the circuit illustrated in FIG. 4 is that it does not disrupt the pure linearity of the voltage to current conversion. Prior circuit techniques maintain linearity only through the cancellation of "RON" variation that occurs for differential drive. Even for ideal square-law MOSFETs the cancellation is only good for small drops across the switches. Thus, the present disclosure can allow more aggressive shrinking of the switch sizes or greater linearity at a given size.

Figure 5:
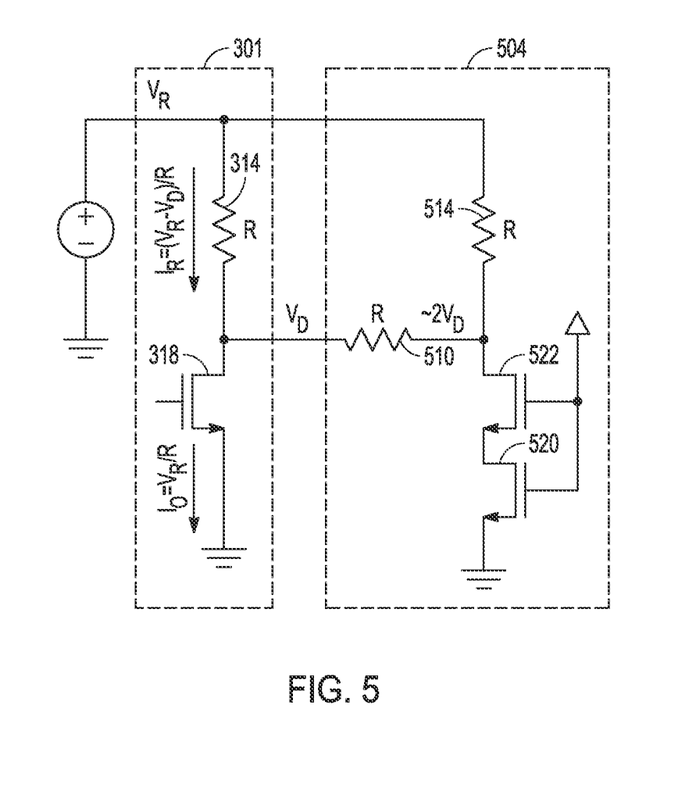
FIG. 5 illustrates an example of a passive compensation circuit.

FIG. 5 illustrates an example of a passive correction circuit. The passive correction circuit illustrated in FIG. 5 eliminates the use of an amplifier, and uses active devices (switches) simply as passive resistors. In an example, the correction circuitry 504 can be connected to a leg of a DAC switch bridge 301. The leg of the DAC switch bridge can include a reference resistor 314 and a switch 318, The switch 318 can have a voltage drop $V_D$ that can produce a current defect in the circuit. The voltage drop across the switch 318 can be replicated within correction circuitry 504. The correction circuitry 504 can include a second resistor 514 connected to $V_R$ which replicates the reference resistor 314. A third resistor 510 can be connected between the reference resistor 314 and the second resistor 514. The correction circuitry 504 can further include one or more replica switches, such as switches 520 and 522. The replica switches can be MOS devices driven with the same voltage, thus each producing substantially the same voltage drop as the switch 318 in the leg of the DAC switch bridge 301. In the example illustrated in FIG. 5, the correction circuitry 504 can produce a switch drop produced by series combination of the replica switches 520 and 522 that is approximately twice the value of $V_D$.

By removing the amplifier, the correction circuitry 504 of the passive correction circuit has the advantage of eliminating noise caused by and power used by the amplifiers used in the circuits discussed in FIGS. 2-4. The correction circuitry 504 of the passive correction circuit can also reduce or eliminate the need to use a low-pass filter to reduce noise caused by the amplifiers. FIG. 5 illustrates the use of equal value resistors and two series switches in the correction circuitry 504 but a larger voltage can be realized (which can improve noise reduction and power performance) with appropriate sizing of replica switches and resistors. It is understood that the resistor values and amount of replica switches can be adjusted as needed or desired.

Figure 6:
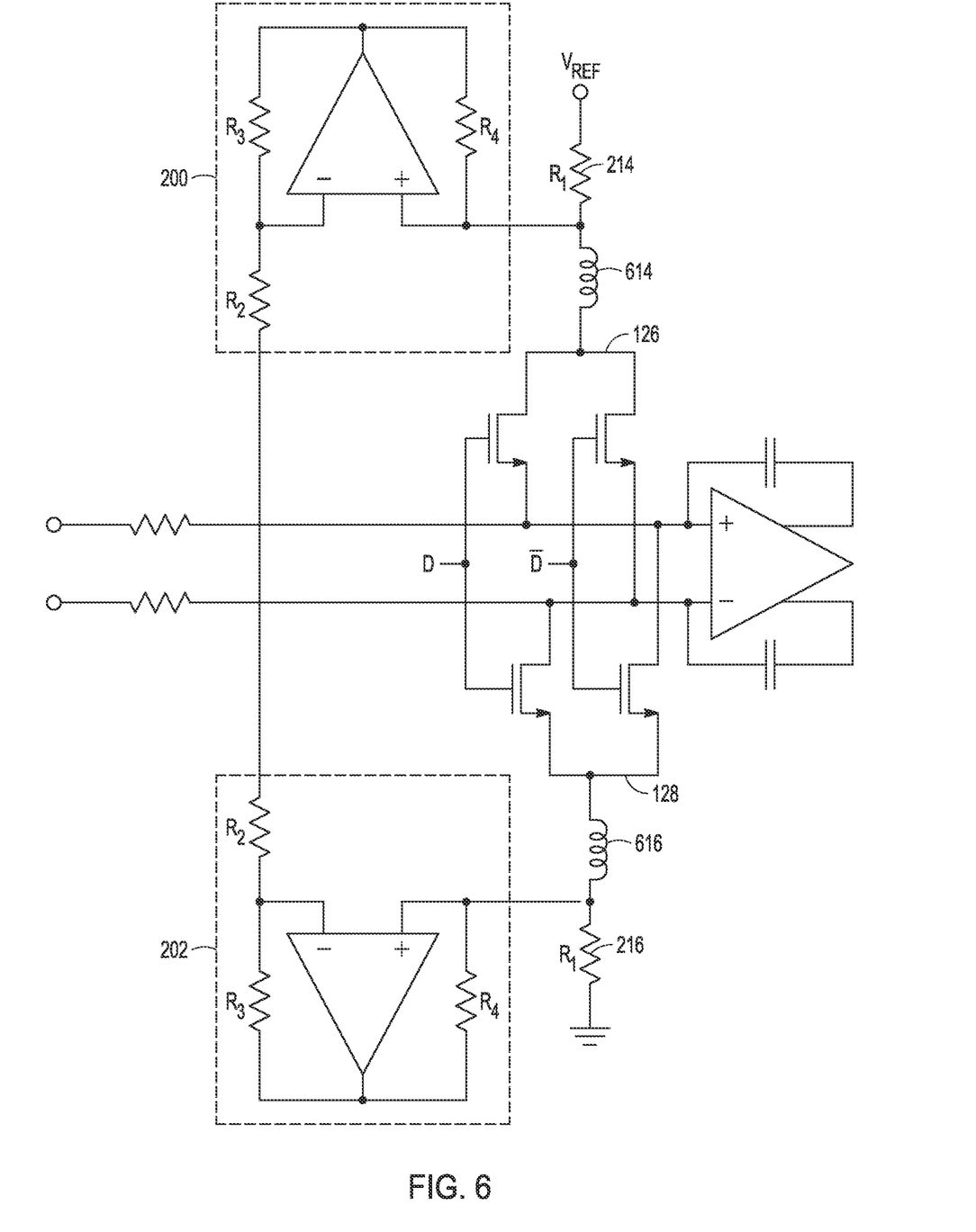
FIG. 6 illustrates an example of a cancelation circuit configured to cancel effects of additional parasitic resistances in a DAC circuit.

FIG. 6 illustrates an example of a cancelation circuit configured to cancel effects of additional parasitic resistances in a DAC circuit. In the example illustrated in FIG. 6, the DAC circuit can further comprise an additional series circuit element, such as a first inductor 614 and/or a second inductor 616. The first inductor 614 can be coupled between the first compensation circuit 200 and the node 126 of the switch bridge. Similarly, the second inductor 616 can be coupled between the second compensation circuit 202 and the node 128 of the switch bridge. The compensation circuits can additionally receive information about voltage drops across the inductors. For example, the first compensation circuit 200 can receive information about the voltage drop across the first inductor 614 and adjust the first compensation current based on the information about the voltage drop across the first inductor 600. Likewise, the second compensation circuit 202 can receive information about the voltage drop across the second inductor 616 and adjust the second compensation current based on that voltage drop.

While FIG. 6 is illustrated showing two compensation circuits and two inductors, it is understood that additional or fewer compensation circuits can be implemented in a particular circuit and the additional series circuit elements can be circuit elements other than inductors (e.g., capacitors, diodes, transistors, or any other parasitic resistive element in the DAC path). One advantage to using inductors as the additional series circuit element is that inductors can provide a noise performance improvement. The inductors can low-pass current noise due to resistors 214 and 216 in the DAC circuit to well below the DAC's operating frequency. This can nearly remove the DAC noise from the wideband ADC performance without additional power. However, because inductors can have substantial parasitic series resistance, which can degrade gain accuracy, the compensation circuit must adjust for this parasitic resistance (e.g., voltage drop).

Figure 7:
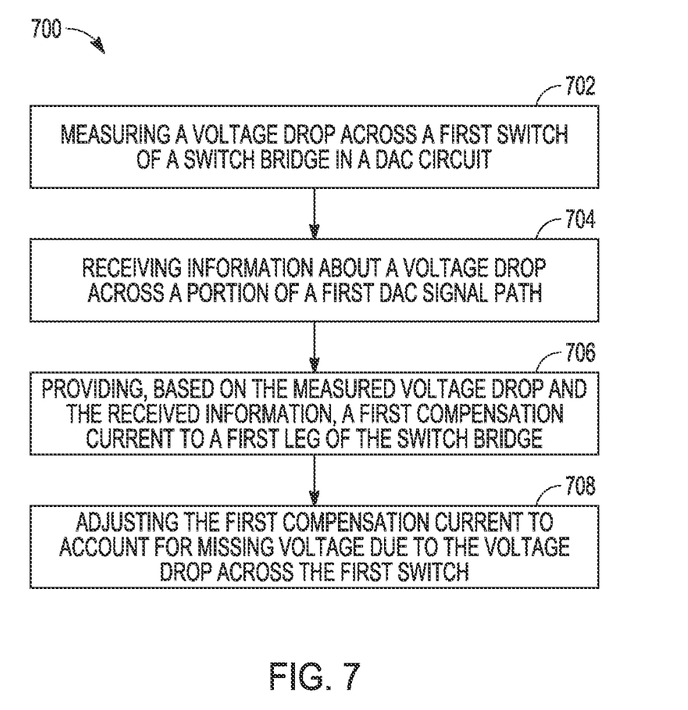
FIG. 7 illustrates an example of a method for correcting a current defect in a DAC circuit.

FIG. 7 illustrates an example of a method 700 for correcting a current defect in a DAC circuit. Operation 702 can include measuring a voltage drop across a first switch of a switch bridge in the DAC circuit. The switch bridge can include one or more switches. The one or more switches can be MOS switches, such as N-MOS transistors, P-MOS transistors, or any similar switching devices. The switch bridge can further include one or more legs on which the switches can be connected in series. It is understood the DAC circuit can have as many switch bridges with as many legs on each bridge as desired or appropriate for the particular circuit.

Operation 704 can include receiving information about a voltage drop across a portion of a first DAC signal path. The information about the voltage drop can be a measured voltage drop across one or more switches in the switch bridge of the DAC making up at least a portion of the first DAC signal path. Additionally, or alternatively, the information about the voltage drop of the DAC signal path can be obtained from a voltage drop across one or more switches in a replica circuit. When a replica circuit is used, it can be configured to mimic the voltage drop across the portion of the DAC: signal path to which compensation current will be directed. The measured voltage drop will dictate how much voltage is to be output, which will in turn dictate the value of the current fed from compensation circuitry connected to one or more legs of the switch bridge of the DAC.

Operation 706 can include providing, based on the measured voltage drop and the received information, a first compensation current to a first leg of the switch bridge, and Operation 708 can include adjusting the first compensation current to account for missing voltage due to the voltage drop across the first switch. Based on the amount of the "missing" current (e.g., value of the current defect) in the DAC signal path caused by the voltage drop across one or more switches of the switch bridge, the compensation circuit can increase the gain of the voltage drop (e.g., output some multiple of the voltage drop). The value of this "gained up" voltage will affect the value of the current from the output of the compensation circuit fed into the leg of the switch bridge. The compensation current can then "fill in" the missing current discussed above in FIG. 3. In an example, the compensation current can be adjusted as needed to account for missing voltage due to switches in the DAC or additional series circuit elements (e.g., inductors) connected in the DAC signal path.

Additional Notes and Examples

Example 1 is a digital-to-analog converter (DAC) circuit comprising: a switch bridge circuit having a first leg that provides respective first and second DAC signal paths; and a first compensation circuit configured to provide a first compensation current to the first leg of the switch bridge to compensate for a current defect caused by a voltage drop across a portion of the first DAC signal path.

In Example 2, the subject matter of Example 1 optionally includes wherein the first leg of the switch bridge comprises a first switch, wherein the first compensation circuit comprises a voltage generator circuit configured to generate a voltage signal having a voltage magnitude that corresponds to the voltage drop across the portion of the first DAC signal path.

In Example 3, the subject matter of Example 2 optionally includes wherein the voltage generator circuit is a replica switch configured to mimic operation of the first switch, and wherein the first compensation current is derived from the replica switch before being provided to the first leg of the switch bridge.

In Example 4, the subject matter of any one or more of Examples 2-3 optionally include wherein the voltage generator circuit is a second leg of the switch bridge.

In Example 5, the subject matter of any one or more of Examples 2-4 optionally include wherein the voltage generator circuit comprises a scaled switch configured to provide a voltage drop greater than the voltage drop across the portion of the first DAC signal path.

In Example 6, the subject matter of Example 5 optionally includes wherein the compensation circuit further comprises a resistor coupled from the scaled switch to the first leg of the switch bridge.

In Example 7, the subject matter of any one or more of Examples 1-6 optionally include wherein the first compensation circuit is configured to receive information about the voltage drop across the portion of the first DAC signal path and, in response, the first compensation circuit is configured to generate the first compensation current.

In Example 8, the subject matter of Example 7 optionally includes wherein the first compensation circuit includes: an amplifier; and a feedback network coupled to the amplifier; wherein a non-inverting input of the amplifier is coupled to the first leg of the switch bridge.

In Example 9, the subject matter of Example 8 optionally includes wherein the amplifier is configured to provide the first compensation current to the first leg of the switch bridge through a compensation resistor, and wherein an output of the amplifier is connected to the compensation resistor.

In Example 10, the subject matter of Example 9 optionally includes wherein the compensation resistor is a high-value resistor, wherein the high-value resistor has a greater resistance than the resistors of the feedback network, and wherein the DAC circuit further comprises: a low-pass filter, wherein the low-pass filter includes a capacitor in the feedback network.

In Example 11, the subject matter of any one or more of Examples 1-10 optionally include a second compensation circuit configured to provide a second compensation current to a second leg of the switch bridge to compensate for a voltage drop across a different portion of the DAC signal path, wherein the second compensation circuit includes: a second amplifier; and a second feedback network coupled to the second amplifier; wherein a non-inverting input of the second amplifier is coupled to the second leg of the switch bridge.

In Example 12, the subject matter of any one or more of Examples 1-11 optionally include an additional series circuit element coupled between the first compensation circuit and the first leg of the switch bridge, wherein the first compensation circuit additionally receives information about a voltage drop across the additional series circuit element and adjusts the first compensation current based on the information about the voltage drop across the additional series circuit element.

Example 13 is a method for compensating for a current defect in a digital-to-analog converter (DAC) circuit, the method comprising: measuring a voltage drop across a first switch of a switch bridge in the DAC circuit; receiving information about a voltage drop across a portion of a first DAC signal path, wherein the information about the measured voltage drop includes information about the current defect, and wherein the current defect is caused by the measured voltage drop; and providing, based on the measured voltage drop and the received information, a first compensation current to a first leg of the switch bridge to compensate for the current defect, wherein the first compensation current is provided by a first compensation circuit, the first compensation circuit comprising: an amplifier; a first resistor connected to an output of the amplifier and to an inverting input of the amplifier; a first feedback resistor, the first feedback resistor to conduct current from the output of the amplifier to a positive input of the amplifier; and a third resistor in series with the first resistor.

In Example 14, the subject matter of Example 13 optionally includes adjusting the first compensation current to account for a missing voltage due to the voltage drop across the first switch, and wherein the first compensation circuit is configured to increase a gain of the voltage drop across the first switch and increase the compensation current provided to the first switch.

In Example 15, the subject matter of any one or more of Examples 13-14 optionally include suppressing noise produced by the amplifier by including a low-pass filter in the compensation circuit, wherein the low-pass filter includes a capacitor across the first feedback resistor.

Example 16 is a single-ended continuous time sigma delta (CTSD) analog-to-digital converter (ADC) comprising: an input stage including a pair of input nodes to receive a single-ended input signal; a digital-to-analog converter (DAC) circuit comprising a switch bridge having a first leg and a second leg of the DAC circuit; and a compensation circuit configured to receive information about a voltage drop across first and second switches corresponding to the first and second legs, respectively, of the switch bridge; wherein the compensation circuit is configured to use the received information about the voltage drops across the first and second switches to provide respective compensation current signals to the first and second legs of the switch bridge to compensate for a first current defect caused voltage drop across the first switch and a second current defect caused by the voltage across the second switch.

In Example 17, the subject matter of Example 16 optionally includes a low-pass filter to suppress noise produced by an amplifier included in the compensation circuit, wherein the low-pass filter includes a capacitor across a feedback resistor coupled to the amplifier.

In Example 18, the subject matter of any one or more of Examples 16-17 optionally include an inductor coupled between the compensation circuit and the first leg or the second leg of the switch bridge, wherein compensation circuit additionally receives information about a voltage drop across the inductor and adjusts the compensation current based on the information about the voltage drop across the inductor.

In Example 19, the subject matter of any one or more of Examples 16-18 optionally include wherein at least one of the first leg of the switch bridge or the second leg of the switch bridge includes a reference resistor, and wherein the compensation circuit includes: a second resistor in parallel with the reference resistor; a third resistor between the reference resistor and the second resistor; and at least one replica switch configured to mimic operation of at least one of the first or second switches in the switch bridge.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example Or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the embodiments should be determined with reference to the appended claims, along with the full scope of equivalents to which such claims are entitled.

What is claimed is:

1. A digital-to-analog converter (DAC) circuit comprising:
    a switch bridge circuit having a first leg that provides respective first and second DAC signal paths; and
    a first compensation circuit configured to provide a first compensation current to the first leg of the switch bridge to compensate for a current defect caused by a voltage drop across a portion of the first DAC signal path, wherein the first leg of the switch bridge comprises a first switch, and wherein the first compensation circuit comprises a voltage generator circuit configured to generate a voltage signal having a voltage magnitude that corresponds to the voltage drop across the portion of the first DAC signal path.

2. The DAC circuit of claim 1, wherein the voltage generator circuit is a replica switch configured to mimic operation of the first switch, and wherein the first compensation current is derived from the replica switch before being provided to the first leg of the switch bridge.

3. The DAC circuit of claim 1, wherein the voltage generator circuit is a second leg of the switch bridge.

4. The DAC circuit of claim 1, wherein the voltage generator circuit comprises a scaled switch configured to provide a voltage drop greater than the voltage drop across the portion of the first DAC signal path.

5. The DAC circuit of claim 4, wherein the compensation circuit further comprises a resistor coupled from the scaled switch to the first leg of the switch bridge.

6. The DAC circuit of claim 1, wherein the first compensation circuit is configured to receive information about the voltage drop across the portion of the first DAC signal path and, in response, the first compensation circuit is configured to generate the first compensation current.

7. The DAC circuit of claim 6, wherein the first compensation circuit includes:
    an amplifier; and
    a feedback network coupled to the amplifier;
    wherein a non-inverting input of the amplifier is coupled to the first leg of the switch bridge.

8. The DAC circuit of claim 7, wherein the amplifier is configured to provide the first compensation current to the first leg of the switch bridge through a compensation resistor, and wherein an output of the amplifier is connected to the compensation resistor.

9. The DAC circuit of claim 8, wherein the compensation resistor is a high-value resistor, wherein the high-value resistor has a greater resistance than the resistors of the feedback network, and wherein the DAC circuit further comprises:
a low-pass filter, wherein the low-pass filter includes a capacitor in the feedback network.

10. The DAC circuit of claim 1, further comprising:
a second compensation circuit configured to provide a second compensation current to a second leg of the switch bridge to compensate for a voltage drop across a different portion of the DAC signal path, wherein the second compensation circuit includes:
a second amplifier; and
a second feedback network coupled to the second amplifier;
wherein a non-inverting input of the second amplifier is coupled to the second leg of the switch bridge.

11. The DAC circuit of claim 1, further comprising an additional series circuit element coupled between the first compensation circuit and the first leg of the switch bridge, wherein the first compensation circuit additionally receives information about a voltage drop across the additional series circuit element and adjusts the first compensation current based on the information about the voltage drop across the additional series circuit element.

12. A method for compensating for a current defect in a digital-to-analog converter (DAC) circuit, the method comprising:
measuring a voltage drop across a first switch of a switch bridge in the DAC circuit;
receiving information about a voltage drop across a portion of a first DAC signal path, wherein the information about the measured voltage drop includes information about the current defect, and wherein the current defect is caused by the measured voltage drop; and
providing, based on the measured voltage drop and the received information, a first compensation current to a first leg of the switch bridge to compensate for the current defect, wherein the first compensation current is provided by a first compensation circuit, the first compensation circuit comprising:
an amplifier;
a first resistor connected to an output of the amplifier and to an inverting input of the amplifier;
a first feedback resistor, the first feedback resistor to conduct current from the output of the amplifier to a positive input of the amplifier; and
a third resistor in series with the first resistor.

13. The method of claim 12, further comprising:
adjusting the first compensation current to account for a missing voltage due to the voltage drop across the first switch, and wherein the first compensation circuit is configured to increase a gain of the voltage drop across the first switch and increase the compensation current provided to the first switch.

14. The method of claim 12, further comprising:
suppressing noise produced by the amplifier by including a low-pass filter in the compensation circuit, wherein the low-pass filter includes a capacitor across the first feedback resistor.

15. A single-ended continuous time sigma delta (CTSD) analog-to-digital converter (ADC) comprising:
an input stage including a pair of input nodes to receive a single-ended input signal:
a digital-to-analog converter (DAC) circuit comprising a switch bridge having a first leg and a second leg of the DAC circuit; and
a compensation circuit configured to receive information about a voltage drop across first and second switches corresponding to the first and second legs, respectively, of the switch bridge;
wherein the compensation circuit is configured to use the received information about the voltage drops across the first and second switches to provide respective compensation current signals to the first and second legs of the switch bridge to compensate for a first current defect caused voltage drop across the first switch and a second current defect caused by the voltage across the second switch.

16. The single-ended CTSD ADC of claim of claim 15, further comprising:
a low-pass filter to suppress noise produced by an amplifier included in the compensation circuit, wherein the low-pass filter includes a capacitor across a feedback resistor coupled to the amplifier.

17. The single-ended CTSD ADC of claim of claim 15, further comprising:
an inductor coupled between the compensation circuit and the first leg or the second leg of the switch bridge, wherein compensation circuit additionally receives information about a voltage drop across the inductor and adjusts the compensation current based on the information about the voltage drop across the inductor.

18. The single-ended CTSD ADC of claim of claim 15, wherein at least one of the first leg of the switch bridge or the second leg of the switch bridge includes a reference resistor, and wherein the compensation circuit includes:
a second resistor in parallel with the reference resistor;
a third resistor between the reference resistor and the second resistor; and
at least one replica switch configured to mimic operation of at least one of the first or second switches in the switch bridge.

* * * * *